United States Patent
Cois et al.

(10) Patent No.: US 12,072,391 B2
(45) Date of Patent: Aug. 27, 2024

(54) METHOD FOR CONTROLLING A CHARGING CURRENT LIMITING VALUE FOR A BATTERY MANAGEMENT SYSTEM, BATTERY MANAGEMENT SYSTEM

(71) Applicant: Robert Bosch GmbH, Stuttgart (DE)

(72) Inventors: Olivier Cois, Kernen (DE); Aleksandar Aleksandrov, Stuttgart (DE); Christoph Kroener, Freiberg am Neckar (DE); Jens Becker, Benningen am Neckar (DE); Melwin Pascal Watterott, Bissingen an der Teck (DE); Triantafyllos Zafiridis, Heilbronn (DE); Vincent Scharff, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 120 days.

(21) Appl. No.: 17/887,986

(22) Filed: Aug. 15, 2022

(65) Prior Publication Data
US 2023/0049272 A1 Feb. 16, 2023

(30) Foreign Application Priority Data
Aug. 16, 2021 (DE) .......................... 102021208940.2

(51) Int. Cl.
*G01R 31/396* (2019.01)
*G01R 31/36* (2020.01)
*H02J 7/00* (2006.01)

(52) U.S. Cl.
CPC ....... *G01R 31/396* (2019.01); *G01R 31/3648* (2013.01); *H02J 7/0048* (2020.01); *H02J 7/00716* (2020.01); *H02J 7/007194* (2020.01)

(58) Field of Classification Search
None
See application file for complete search history.

(56) References Cited

U.S. PATENT DOCUMENTS

2021/0249885 A1* 8/2021 Lim ..................... G01R 31/382

FOREIGN PATENT DOCUMENTS

DE 102012222723 A1 6/2014

* cited by examiner

*Primary Examiner* — Jas A Sanghera
(74) *Attorney, Agent, or Firm* — Michael Best & Friedrich LLP (57) ABSTRACT

A method for controlling a charging current limiting value for a battery management system. In one example, the method includes determining, for a measured temperature and a prescribed state of charge, reference currents for various time intervals; calculating a corresponding reference time constant for each reference current by using a model for the calculation of a mean value of a charging current based on a continuous current; constituting a diagram for the relationship between the reference time constant and the reference current; determining a predictive time constant by the comparison of a measured value of a charging current with the reference currents; calculating a predictive limiting mean value of the charging current; and calculating a first predictive limiting value $i_{predS}$ for a short predictive time $t_{predS}$, a second predictive limiting value $i_{predL}$ for a long predictive time $t_{predL}$, and a third predictive limiting value $i_{predP}$ for a continuous predictive time.

9 Claims, 7 Drawing Sheets

METHOD FOR CONTROLLING A CHARGING CURRENT LIMITING VALUE FOR A BATTERY MANAGEMENT SYSTEM, BATTERY MANAGEMENT SYSTEM

BACKGROUND OF THE INVENTION

The invention relates to a method for controlling a charging current limiting value for a battery management system.

The invention further relates to a battery management system, which is designed to execute the method according to the invention.

The invention also relates to a battery having one or more battery cells, which is designed to execute the method according to the invention and/or which comprises the battery management system according to the invention.

The invention further relates to a vehicle, which is designed to execute the method according to the invention, and/or which comprises the battery management system according to the invention and/or which comprises the battery according to the invention.

It is apparent that, in future, electrically-propelled motor vehicles will be employed to an increasing extent. In electrically-propelled motor vehicles of this type, such as e.g. hybrid vehicles and electric vehicles, rechargeable batteries are employed, predominantly for the supply of electrical energy to electric drive machines.

As an electrochemical system, a battery cell can only take up a specific amount of charge during the charging process. Under specific conditions, undesirable secondary reactions may occur, such as lithium plating, for example. During the charging process, lithium is introduced into the anode. If, however, the charging current is too high, lithium metal is deposited on the anode surface instead of being intercalated. Conditions which might lead to lithium plating are, for example, a high charging current, a long charging time without a break, a low temperature and a high state of charge SOC. Lithium plating can lead to a high loss of capacity, a significant increase in resistance and a large reduction in the performance of the battery cell. Ultimately this effect has a direct influence upon the available power, and can shorten the service life of the battery cell.

SUMMARY OF THE INVENTION

The object of the present invention is the calculation of a maximum permissible current in the charging direction without causing lithium plating.

A method is proposed for controlling a charging current limiting value for a battery management system. The battery management system is designed for the monitoring and control of a battery. The battery can comprise one or more series- or parallel-connected battery cells. The battery cell is configured in the form of a lithium-ion cell.

According to the invention, firstly, for a measured temperature $T_{sens}$ and a prescribed state of charge SOC, reference currents $i_{ref}$ are determined for various time intervals $t_{ref}$. The reference current $i_{ref}$ represents the maximum permissible charging current at this measured temperature $T_{sens}$ and this prescribed state of charge SOC for the corresponding time intervals $t_{ref}$. For example, for a measured temperature $T_{sens}$ of 25° C. and a prescribed state of charge SOC, reference currents $i_{ref2s}$, $i_{ref10s}$, and $i_{ref30s}$ are determined for the corresponding time intervals $t_{ref}$ of 2 s, 10 s and 30 s. If, for example, the temperatures defined in the cell data sheet are from 20° C. and 30° C., these reference currents can be interpolated, if this is permitted by the cell data sheet.

Thereafter, for each reference current $i_{ref}$, a corresponding reference time constant $\tau_{ref}$ is calculated by the application of a model for the calculation of a mean value $i_{avrg}$ of a charging current $i_{req}$, with reference to a continuous current $i_{cont}$, which corresponds to the minimum current permissible without lithium plating. The main function of the model is the authorization of a specific current for the time interval considered, by reference to the cell data sheet. This model thus permits the modelling of the dynamic behavior of current limiting values. For example, if it proceeds from the cell data sheet that a current of 150 A is only permitted to last for 2 s, this current must then be permitted for 2 s or less. To this end, the reference time constant $\tau_{ref}$ is adjusted such that the limiting value for current occurs at 2 s or earlier. For example, for the respective reference currents $i_{ref2s}$, $i_{ref10s}$ and $i_{ref30s}$, a corresponding reference time constant $\tau_{ref2s}$, $\tau_{ref10s}$ and $\tau_{ref30s}$ is calculated.

With reference to the calculated reference time constants $\tau_{ref}$ and the reference currents $i_{ref}$ determined, a diagram is then constituted for the relationship between the reference time constant $\tau_{ref}$ and the reference current $i_{ref}$ for each specified temperature T and each specified state of charge SOC.

Thereafter, a predictive time constant $\tau_{pred}$ is determined by the comparison of a measured value $i_{sens}$ of a charging current $i_{req}$ with the reference currents $i_{ref}$. If the measured value $i_{sens}$ of the charging current $i_{req}$ is equal to a reference current $i_{ref}$, the predictive time constant $\tau_{pred}$ is equal to the reference time constant $\tau_{ref}$ which corresponds to this reference current $i_{ref}$. Otherwise, the predictive time constant $\tau_{pred}$ is determined by interpolation.

A predictive limiting mean value $i_{pred}$ of the charging current $i_{req}$ is then calculated on the basis of the continuous current $i_{cont}$, a predictive time $t_{pred}$ and the predictive time constant $\tau_{pred}$. The predictive time $t_{pred}$ corresponds to those time periods during which a constant current can be employed, with no limitation executed by the battery management system. The predictive time can be customer-specific.

The reference current $i_{ref}$ and the duration $t_{ref}$ of the reference current $i_{ref}$ are cell-specific and temperature-dependant as well as state-of-charge dependent. These variables can be sourced directly from the cell data sheet, or obtained by measurements.

The model for the calculation of the mean value $i_{avrg}$ of a charging current $i_{req}$ is preferably configured in the form of a PT1-element, also described as a PT1-filter. A PT1-element is understood as an LTI (linear time-invariant) transmission element in control technology, which assumes a proportional transmission behavior with a time delay of the first order. A customary example is a low-pass of the $1^{st}$ order, which can be achieved, for example, by means of a RC-element. Advantageously, a PT1 element is simple to implement.

The method according to the invention is explained by reference to the model, which is preferably configured in the form of a PT1-element. The mean value $i_{avrg}$ of a charging current $i_{req}$ is calculated as follows by a first equation:

$$i_{avrg}(t) = \left(1 - e^{-\frac{t}{\tau}}\right) \cdot i_{sens}(t) + i_{avrg0} \cdot e^{-\frac{t}{\tau}} \tag{1}$$

Where $i_{avrg}(t)$ is the present mean value of the charging current $i_{req}$, and is time-dependent, $i_{avrg0}$ is the initial mean value of the charging current $i_{req}$, t is the time, t is the time constant of the PT1-element and $i_{sens}(t)$ is the measured value of the charging current $i_{req}$.

The mean value $i_{avrg}(t)$ of the charging current $i_{req}$ is then compared as follows by means of a second equation, with a continuous current $i_{cont}$, which is temperature-dependent as well as state-of-charge dependent:

$$i_{avrg}(t) \leq i_{cont}(T, SOC) \qquad (2)$$

This continuous current $i_{cont}$ corresponds to the minimum current permissible without lithium plating, and can be sourced from the cell data sheet. The continuous current $i_{cont}$ is relevant to the limitation of the charging current $i_{req}$, and ensures that no lithium plating of the battery cell occurs.

Provided that $i_{avrg}(t)$ is equal to $i_{cont}$, a predictive limiting mean value $i_{pred}$, which corresponds to the measured value $i_{sens}$ of the charging current $i_{req}$ in the first equation, can be calculated as follows by means of a third equation:

$$i_{pred}(t) = \frac{i_{cont}(T, SOC) - i_{avrg0} \cdot e^{-\frac{t}{\tau}}}{1 - e^{-\frac{t}{\tau}}} \qquad (3)$$

Where T is the temperature and SOC is the state of charge of the battery cell.

For a specific temperature T and a specific predictive time interval $t_{pred}$, a new third equation can be derived as follows:

$$i_{pred}(t_{pred}) = \frac{i_{cont} - i_{avrg0} \cdot e^{-\frac{t_{pred}}{\tau}}}{1 - e^{-\frac{t_{pred}}{\tau}}} \qquad (3')$$

In this case, a constant k is introduced. This constant k is defined as follows:

$$k = e^{-\frac{t_{pred}}{\tau}}$$

A simplified new third equation is thus derived from the new third equation as follows:

$$i_{pred}(t_{pred}) = \frac{i_{cont} - i_{avrg0} \cdot k}{1 - k} \qquad (3'')$$

The initial mean value $i_{avrg0}$ can be obtained by means of the reference current $i_{ref}$ and the time $t_{ref}$ of the reference current $i_{ref}$ in the form of a step response, which is described as follows in a fourth equation:

$$i_{avrg0}(t_{ref}) = \left(1 - e^{-\frac{t_{ref}}{\tau}}\right) \cdot i_{ref} \qquad (4)$$

With reference to the simplified new third equation (3") and the fourth equation, the predictive limiting mean value $i_{pred}$ for a specific predictive time interval $t_{pred}$ is calculated as follows by means of a fifth equation:

$$i_{pred}(t_{pred}) = \frac{i_{cont} - \left(1 - e^{-\frac{t_{ref}}{\tau}}\right) \cdot i_{ref} \cdot k}{1 - k} \qquad (5)$$

Provided that $i_{pred}(t_{pred})$ is equal to $i_{ref}$, the time constant t is derived as follows by means of a sixth equation:

$$\tau = \frac{-t_{ref}}{\ln\left(\frac{i_{ref} - i_{cont}}{k \cdot i_{ref}}\right)} \qquad (6)$$

A time constant τ is thus calculated for each specified reference current $i_{ref}$ and the specified time $t_{ref}$. By means of the sixth equation, a new time constant t can be calculated for each specified temperature T and each specified state of charge SOC, which is adjusted according to the measured value $i_{sens}$ of the charging current $i_{req}$.

The measured value $i_{sens}$ of the charging current $i_{req}$ is compared with the reference current $i_{ref}$ for a specific temperature T, a specific state of charge SOC and a specific time $t_{ref}$, in order to derive an appropriate predictive time constant $\tau_{pred}$.

If, for example, the measured value $i_{sens}$ of the charging current $i_{req}$ is equal to the reference current $i_{ref2s}$ for a time $t_{ref}$ of 2 s, a predictive time constant $\tau_{pred}$ can be calculated by means of the sixth equation. The predictive time constant $\tau_{pred}$ is equal to the reference time constant $\tau_{ref2s}$ for the reference current $i_{ref2s}$ for a time $t_{ref}$ of 2 s. The reduction of the charging current $i_{req}$ then commences after 2 s.

Determination of the predictive time constant $\tau_{pred}$ is preferably executed by linear interpolation. The predictive time constant $\tau_{pred}$ is thus dynamic, and is adjusted according to the measured value $i_{sens}$ of the charging current $i_{req}$.

If, for example, the measured value $i_{sens}$ of the charging current $i_{req}$ is greater than the reference current $i_{ref10s}$ for a time $t_{ref}$ of 10 s, but is smaller than the reference current $i_{ref2s}$ for a time $t_{ref}$ of 2 s, a predictive time constant $\tau_{pred}$ can be determined by linear interpolation between the reference time constant $\tau_{ref2s}$ for the reference current $i_{ref2s}$ for a time $t_{ref}$ of 2 s and the reference time constant $\tau_{ref10s}$ for the reference current $i_{ref10s}$ for a time $t_{ref}$ of 10 s.

By means of the predictive time constant $\tau_{pred}$ thus determined and the third equation, a predictive limiting mean value $i_{pred}$ can be calculated.

Preferably, an additional point [$i_{min}$; $\tau_{relax}$] is inserted in the diagram for the relationship between the reference time constant $\tau_{ref}$ and the reference current $i_{ref}$. This point is inserted in order to define a relaxation time constant $\tau_{relax}$ for the battery cell in a relaxed or quasi-relaxed state. Thus, $i_{min}$ represents a small current, at which no loading of the cell occurs. This small current $i_{min}$ can be a small charging current or discharge current. By means of this definition, a small relaxation time constant $\tau_{relax}$ can be selected, for example, in order to permit a high recuperation current. This new point can be dependent upon the temperature T and the state of charge SOC.

Preferably, on the basis of the limiting mean value $i_{pred}$, a first predictive limiting value $i_{predS}$ for a short predictive time $t_{predS}$, a second predictive limiting value $i_{predL}$ for a long predictive time $t_{predL}$ and a third predictive limiting value $i_{predP}$ for a continuous predictive time $t_{predP}$ are calculated. For example, a time of less than 2 s can be defined as a short predictive time $t_{predS}$. For example, a long predictive time $t_{predL}$ can be equal to 2 s, whereas a continuous predictive time $t_{predP}$ can be equal to 10 s. These predictive times can be customer-specific. In general, these predictive times are fixed values. The predictive time $t_{pred}$ corresponds to those time periods during which a constant current can be employed, with no limitation executed by the battery management system. This constant current can be employed, for example, for the calculation of the third predictive limiting value $i_{predP}$.

Preferably, the constant $$k = e^{-\frac{t_{pred}}{\tau}}$$

employed in the calculation of the first predictive limiting value $i_{predS}$ is established. By the establishment of the constant k and the variation of the time constant $\tau$, which is also described as a short predictive time constant $\tau_{predS}$, the first predictive limiting value $i_{predS}$ is also dynamic, as it adjusts according to the present thermal loading and the loading for lithium plating of the battery cell.

For the calculation of the second predictive limiting value $i_{predL}$ and a third predictive limiting value $i_{predP}$, two conditions are to be fulfilled.
Firstly:

$$k_S \geq k_L(T,SOC) \geq k_P(T,SOC)$$

Where ks is the constant $$k = e^{-\frac{t_{pred}}{\tau}}$$

for the first predictive limiting value $i_{predS}$, which is a fixed value, $k_L$(T, SOC) is the constant $$k = e^{-\frac{t_{pred}}{\tau}}$$

for the second predictive limiting value $i_{predL}$ and $k_P$(T, SOC) is the constant $$k = e^{-\frac{t_{pred}}{\tau}}$$

for the third predictive limiting value $i_{predP}$. The constants $k_L$(T, SOC) and $k_P$(T, SOC) are temperature-dependent as well as state-of-charge dependent.

Secondly, if the PT1-element is equal to zero, it is the case that the predictive limiting value $i_{predL}$ for a long predictive time $t_{predL}$ should represent the reference current $i_{ref}$ for this long time $t_{predL}$ and for the present temperature T of the battery cell. By "PT1-element is equal to zero", it is to be understood that the mean value $I_{avrg}$ of the charging current $i_{req}$ is equal to zero. The constant $k_L$(T, SOC) for the second predictive limiting value $i_{predL}$ is defined as follows:

$$k_L(T, SOC) = e^{-\frac{t_{predL}}{\tau_{predL}(T,SOC)}}$$

In consideration of these two conditions, the constant $k_L$ and a long predictive time constant $\tau_{predL}$(T, SOC) for the second predictive limiting value $i_{predL}$ are calculated as follows by means of a seventh and eighth equation:

$$k_L(T, SOC) = 1 - \frac{i_{cont}(T, SOC)}{i_{ref,predL}(T, SOC)} \quad (7)$$

$$\tau_{predL}(T, SOC) = -\frac{t_{predL}}{\ln(k_L(T, SOC))} \quad (8)$$

Where $i_{cont}$(T, SOC) is the continuous current corresponding to the minimum current permissible without lithium plating, and can be sourced from the cell data sheet. $i_{ref,predL}$ is the reference current $i_{ref}$ for this long predictive time $t_{predL}$.

The second predictive limiting value $i_{predL}$ is then calculated as follows by means of a ninth equation, which is derived from the third equation:

$$i_{predL}(t) = \frac{i_{cont}(T, SOC) - i_{avrg0} \cdot e^{-\frac{t_{predL}}{\tau_{predL}(T,SOC)}}}{1 - e^{-\frac{t_{predL}}{\tau_{predL}(T,SOC)}}} \quad (9)$$

Calculation of the third predictive limiting value $i_{predP}$ is subject to the same conditions as those applied to the calculation of the second predictive limiting value $i_{predL}$. Thus, $k_L$(T,SOC)$\geq k_P$(T,SOC). Accordingly, the third predictive limiting value $i_{predP}$ can be calculated as follows by means of a tenth equation:

$$i_{predP}(t) = \frac{i_{cont}(T, SOC) - i_{avrg0} \cdot e^{-\frac{t_{predP}}{\tau_{predP}(T,SOC)}}}{1 - e^{-\frac{t_{predL}}{\tau_{predP}(T,SOC)}}} \quad (10)$$

Where $\tau_{predP}$(T, SOC) is the continuous predictive time constant for the third predictive limiting value $i_{predP}$.

A battery management system is further proposed, which is designed to execute the method according to the invention.

A battery having one or more battery cells is also proposed, which is designed to execute the method according to the invention, and/or which comprises the battery management system according to the invention.

A vehicle is further proposed, which is designed to execute the method according to the invention, and/or which comprises the battery management system according to the invention and/or the battery according to the invention.

Advantages of the Invention

By means of the present invention, an algorithm can be efficiently implemented in a battery management system, which limits the current in accordance with the cell specifications, and thus ensures the full availability of capacity and the protection of battery cells against lithium plating and components.

Data from battery cells are directly employed for the calculation of a time constant. By means of the method according to the invention, the predictive limiting mean value of the charging current and the predictive limiting values of the charging current for different predictive times can be calculated. These variables are advantageous, firstly for the detection of potential premature ageing in battery cells, and secondly for the adjustment of a power strategy and a driving strategy for a vehicle.

The method according to the invention moreover permits the determination of a stress level, for the quantification of cell utilization and rapid calibration.

The method according to the invention moreover permits the calculation of the mean value $i_{avrg}$ of the charging current $i_{req}$, which can be employed as a measure of battery loading. This mean value $i_{avrg}$ of the charging current $i_{req}$ can be recorded, as a means of visualizing the stress level of the cell.

Moreover, implementation of the method according to the invention is efficient, as only limited RAM is required for the processors of the battery management system. The method according to the invention takes account of the stress experienced by the cell, using a single integrator.

The method is also flexible in operation. The predictive time horizon or predictive time interval can thus be varied, according to the requirements of a customer.

BRIEF DESCRIPTION OF THE DRAWINGS

Embodiments of the invention are described in greater detail with reference to the drawings and the following description.

In the drawings.

In the following description of embodiments of the invention, identical or similar elements are identified by the same reference symbols, wherein any repeated description of these elements in individual cases is omitted. The figures represent the subject matter of the invention in a schematic manner only.

DETAILED DESCRIPTION

Figure 1:
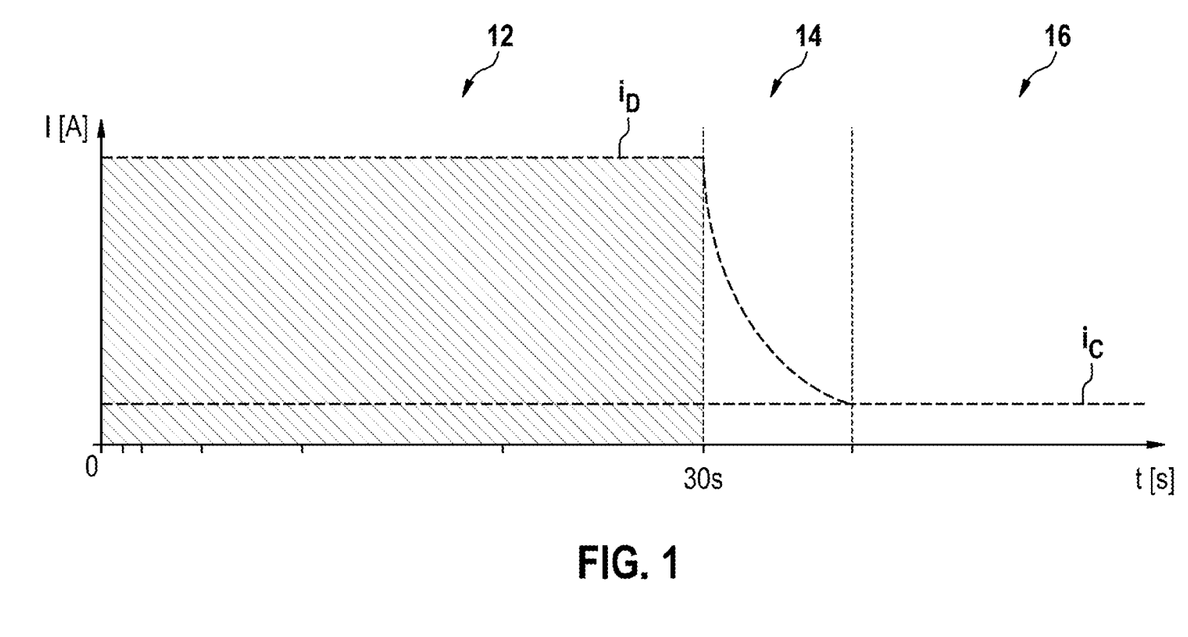
FIG. 1 shows a schematic representation of the anticipated behavior of a charging current limiting value.

FIG. 1 shows a schematic representation of the anticipated behavior of a charging current limiting value of a battery cell. It is anticipated that, by the employment of dynamic limiting values in in a battery management system for the monitoring and control of the battery cell, the initial value of a charging current $i_{req}$, in a first phase 12 of duration, for example, 30s, is not reduced, and these dynamic limiting values $i_D$ are converged in a second phase 14 thereafter to constitute continuous limiting values $i_C$. In a third phase 16, the cell current $i_{req}$ is then limited by the continuous limiting values $i_C$.

Figure 2:
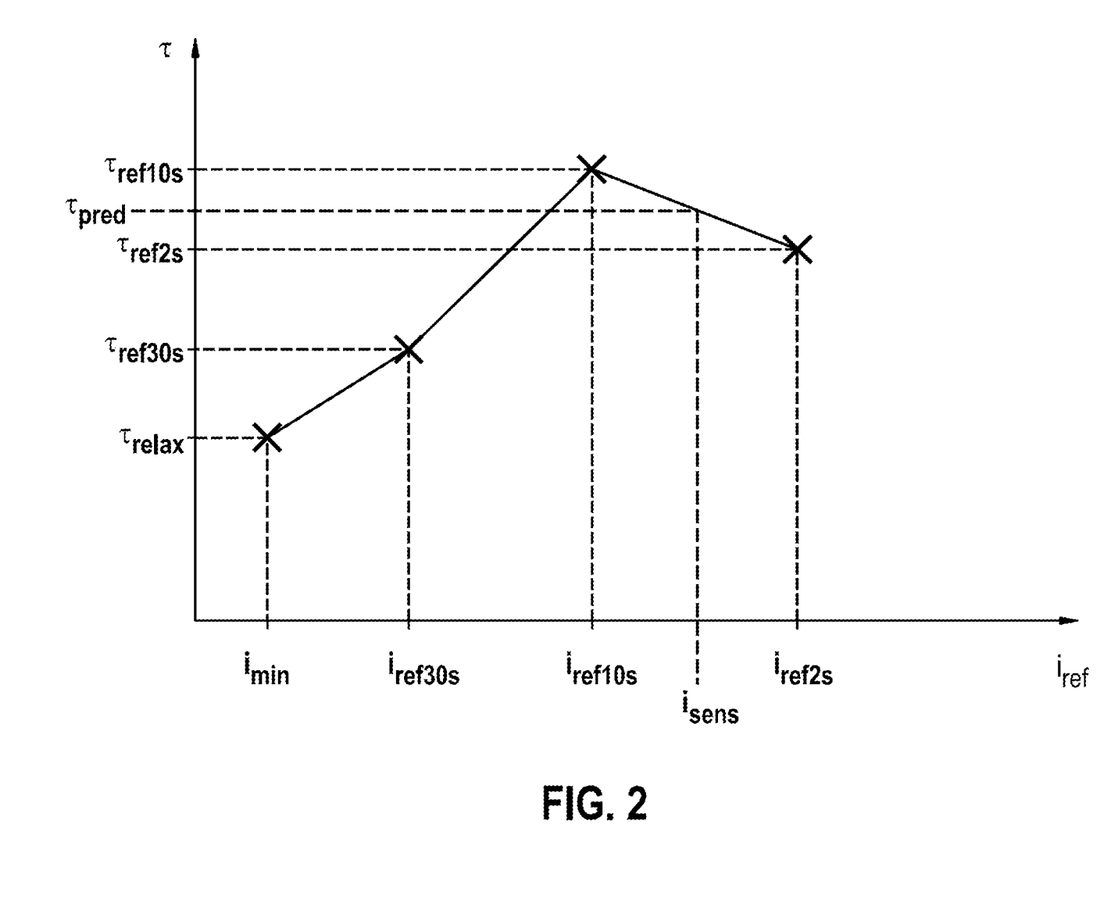
FIG. 2 shows a schematic representation of a diagram for determining a predictive time constant $\tau_{pred}$.

FIG. 2 shows a schematic representation of a diagram for determining a predictive time constant $\tau_{pred}$. This diagram is clarified hereinafter with reference to a model for the calculation of a mean value $i_{avrg}$ of a charging current $i_{req}$ using a PT1-element. As described above, a time constant $\tau$ is calculated for each specific reference current $i_{ref}$, a specific time interval $t_{ref}$ and a specific temperature T and a specific state of charge SOC. In the present case, in FIG. 2, for a specific temperature T, a reference time constant $\tau_{ref30s}$ for a reference current $i_{ref30s}$ of duration 30s, a reference time constant $\tau_{ref10s}$ for a reference current $i_{ref10s}$ of duration 10 s and a reference time constant $\tau_{ref2s}$ for a reference current $i_{ref2s}$ of duration 2 s are calculated.

By means of these data, a diagram is plotted for the relationship between the time constant t and the reference current $i_{ref}$ in FIG. 2.

The measured value $i_{sens}$ of the charging current $i_{req}$ is compared with the reference current $i_{ref}$ for a specific time interval $t_{ref}$ in order to derive an appropriate predictive time constant $\tau_{pred}$.

If, for example, the measured value $i_{sens}$ of the charging current $i_{req}$ is equal to the reference current $i_{ref2s}$, a predictive time constant $\tau_{pred}$ is calculated which is equal to the reference time constant $\tau_{ref2s}$ which has been calculated for the reference current $i_{ref2s}$. The reduction of the charging current $i_{req}$ then commences after 2 s.

If, for example, the measured value $i_{sens}$ of the charging current $i_{req}$ is greater than the reference current $i_{ref10s}$, but is smaller than the reference current $i_{ref2s}$, a predictive time constant $\tau_{pred}$ is determined by linear interpolation between the reference time constant $\tau_{ref10s}$ and the reference time constant $\tau_{ref2s}$.

Moreover, in the diagram according to FIG. 2, an additional point $[i_{min}; \tau_{relax}]$ is inserted. This point is inserted, in order to define a relaxation time constant $\tau_{relax}$ for the battery cell in a relaxed or quasi-relaxed state. Thus, $i_{min}$ represents a small current. By means of this definition, a small relaxation time constant $\tau_{relax}$ can be selected in order to permit, for example, a high recuperation current. This new point can thus be dependent upon the temperature T and the state of charge SOC.

Figure 3A:
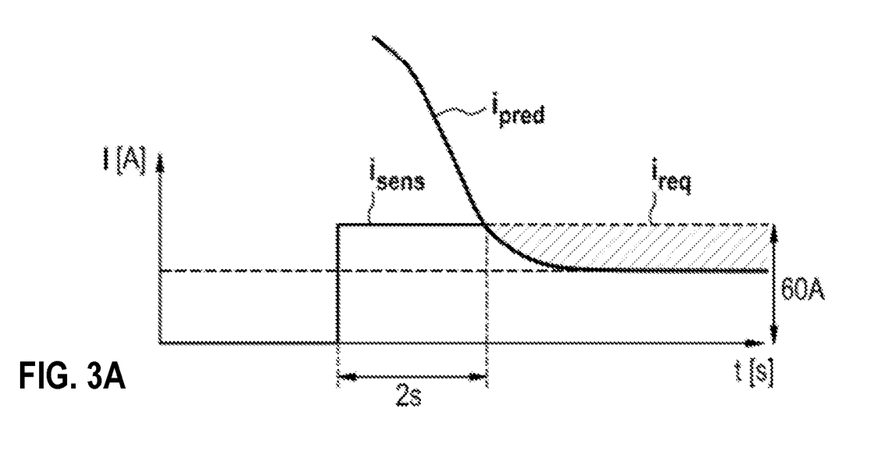
FIG. 3A shows a schematic representation of a temporal characteristic of a limiting mean value $i_{pred}$.

FIG. 3A shows a schematic representation of a temporal characteristic of a limiting mean value $i_{pred}$. A measured value $i_{sens}$ of the charging current $i_{req}$ of 60 A is detected. A charging current $i_{req}$ of 60 A is only permissible for a time of 2 s, without causing lithium plating. A limiting mean value $i_{pred}$ is thus calculated by the method proposed according to the invention. Reduction of the charging current $i_{req}$ then commences after 2 s. The limiting mean value $i_{pred}$ ultimately converges to a continuous current $i_{cont}$, which corresponds to the maximum permissible continuous charging current $i_{req}$.

Figure 3B:
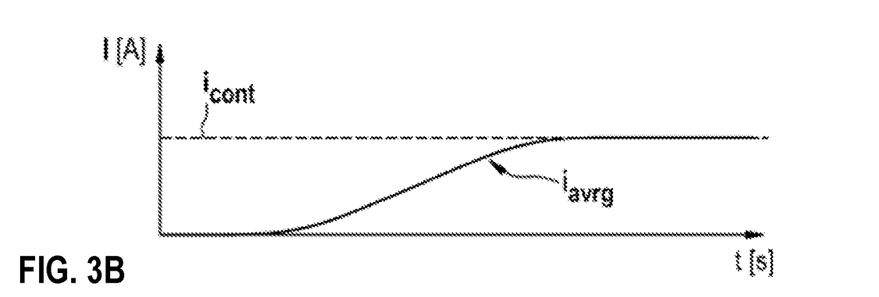
FIG. 3B shows a schematic representation of a temporal characteristic of a mean value $i_{avrg}$ of the charging current $i_{req}$ according to FIG. 3A.
Figure 3C:
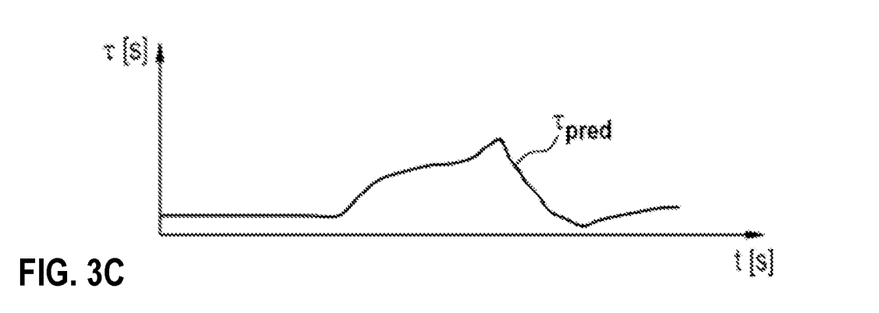
FIG. 3C shows a schematic representation of a temporal characteristic of the predictive time constant $\tau_{pred}$ according to FIG. 3A.

FIG. 3B shows a schematic representation of a temporal characteristic of a mean value $i_{avg}$ of the charging current $i_{req}$ according to FIG. 3A, whereas FIG. 3C shows a schematic representation of a temporal characteristic of a predictive time constant $\tau_{pred}$ according to FIG. 3A. From FIG. 3C, it can be seen that the predictive time constant $\tau_{pred}$ is adjusted according to the measured value $i_{sens}$ of the charging current $i_{req}$.

Figure 4A:
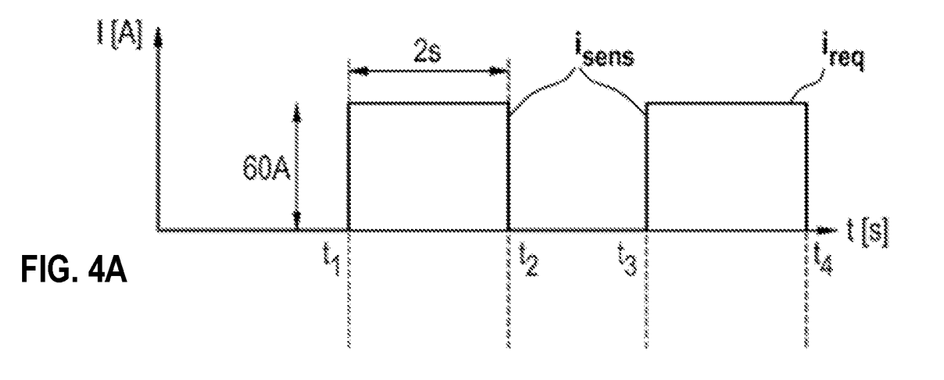
FIG. 4A shows a schematic representation of a temporal characteristic of a charging current $i_{req}$.

FIG. 4A shows a schematic representation of a temporal characteristic of a charging current $i_{req}$. The charging current $i_{req}$ is pulse-shaped, and comprises two current pulses with equal measured values $i_{sens}$ of 60 A. The duration of the respective current pulses is 2 s. At time $t_1$, a first current pulse is transmitted, and the first current pulse ends at time $t_2$. At time $t_3$, a second current pulse is transmitted, and the second current pulse ends at time $t_4$.

Figure 4B:
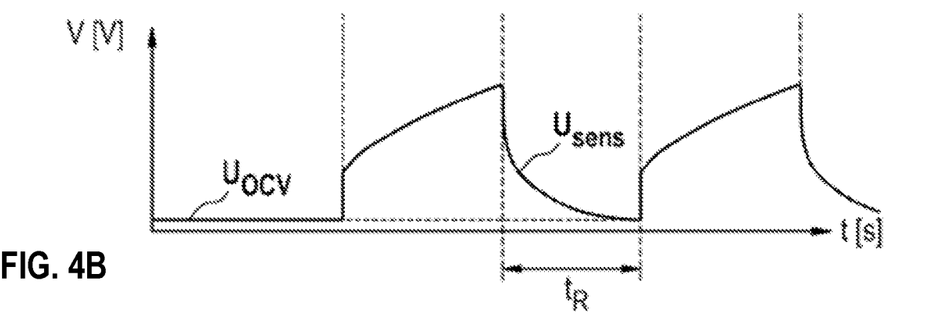
FIG. 4B shows a schematic representation of a temporal characteristic of a measured voltage $u_{sens}$ of the battery cell according to FIG. 4A.

FIG. 4B shows a schematic representation of a temporal characteristic of a measured voltage $u_{sens}$ of the battery cell according to FIG. 4A. The measured voltage $u_{sens}$ of the battery cell has a no-load voltage $u_{OCV}$ at first. Charging with the charging current $i_{req}$ increases the measured voltage $u_{sens}$ of the battery cell. The measured voltage $u_{sens}$ of the battery cell decreases only from the time $t_2$. In an intermediate time period $t_{relax}$ between the first and the second current pulse, specifically between the time $t_2$ and the time $t_3$, the measured voltage $u_{sens}$ decreases at a rate of, for example, 1 mV/min to the no-load voltage $u_{OCV}$. This intermediate time period $t_{relax}$ is also described as the relaxation time.

Figure 4C:
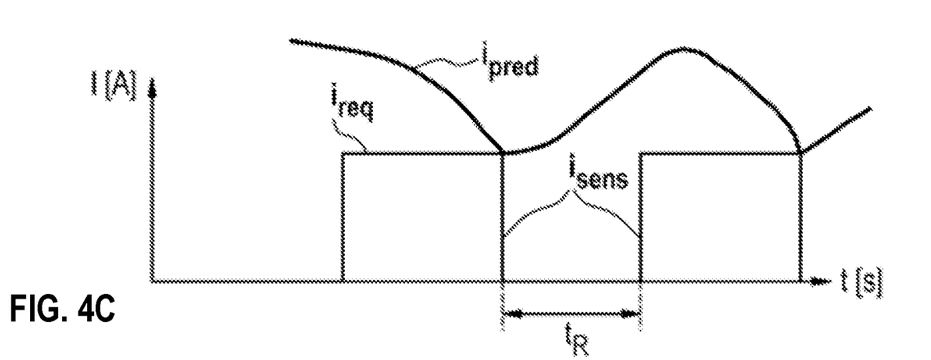
FIG. 4C shows a schematic representation of a temperature characteristic of a charging current $i_{req}$ with limitation of the mean value $i_{avrg}$ thereof according to FIG. 4A.

FIG. 4C shows a schematic representation of a temporal characteristic of a charging current $i_{req}$, with the limitation of the mean value $i_{avrg}$ thereof. The calculated limiting mean value $i_{pred}$ also rises during the intermediate time period $t_{relax}$ or the relaxation time, in order to allow the second current pulse. A cell must be stress-relieved or relaxed, before a further current pulse can be delivered at the maximum permissible capacity. In a resting cell, the measured voltage corresponds to the no-load voltage $u_{OCV}$. For this reason, it is important that a sufficiently long relaxation time should be incorporated, in order to permit the second current pulse. This relaxation time corresponds to the time required for the measured voltage to achieve the no-load voltage of the cell. It will then be possible to set the maximum power, with no risk of lithium plating. This parameter can vary, according to the temperature T, the state of charge SOC and the current strength of the previously employed pulse.

Figure 5A:
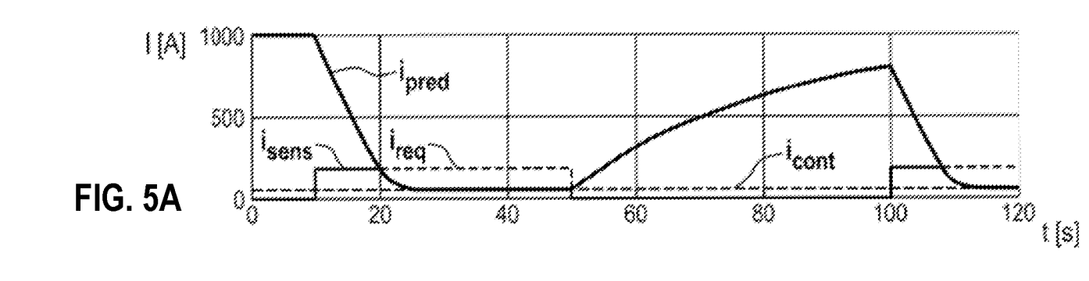
FIG. 5A shows a schematic representation of a temporal characteristic of a charging current $i_{req}$, with limitation of the mean value $i_{avrg}$ thereof according to a first example.
Figure 5B:
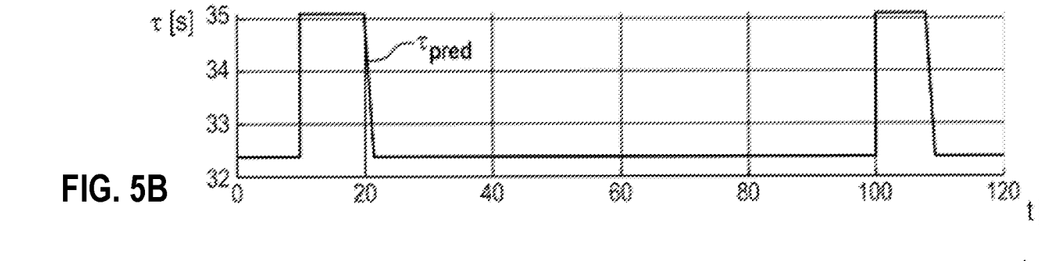
FIG. 5B shows a schematic representation of a temporal characteristic of a predictive time constant $\tau_{pred}$ according to FIG. 5A.
Figure 5C:
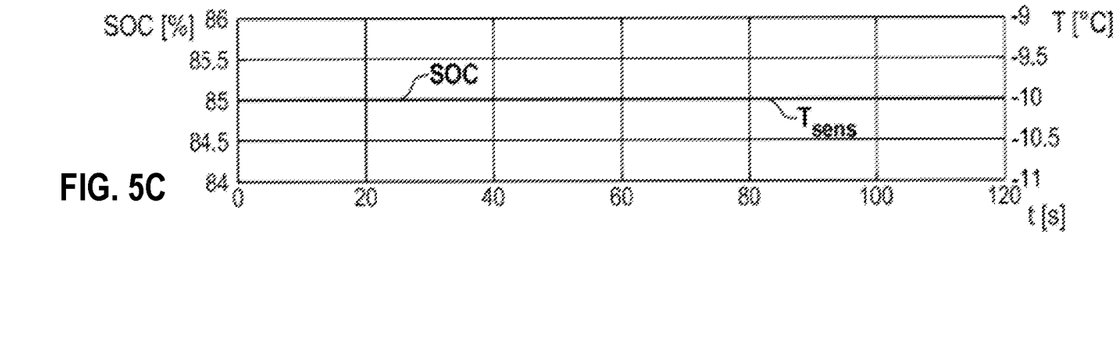
FIG. 5C shows a schematic representation of a temporal characteristic of a state of charge SOC and a temporal characteristic of a measured temperature $T_{sens}$ according to FIG. 5A.

FIG. 5A shows a schematic representation of a temporal characteristic of a charging current $i_{req}$, with limitation of the mean value $i_{avrg}$ thereof, according to a first example, whereas FIG. 5B shows a schematic representation of a temporal characteristic of a predictive time constant $\tau_{pred}$ according to FIG. 5A, and FIG. 5C shows a schematic representation of a temporal characteristic of a state of charge SOC and a temporal characteristic of a measured temperature $T_{sens}$ according to FIG. 5A.

Temporal characteristics of a relaxed battery cell are represented having an initial state of charge SOC of 85%. An initial temperature T of the battery cell is −10° C. The battery cell is thus charged with a charging current $i_{req}$ of 175 A for a time of 30s. The state of charge SOC and the measured temperature $T_{sens}$ remain unchanged.

From FIG. 5A, it can be seen that, at time point t=10 s, a first current pulse, which represents the charging current $i_{req}$, having a measured value $i_{sens}$ of 175 A, is transmitted to the battery cell. The duration of the first current pulse is 30s. From the data sheet for the battery cell 34, it can be determined that a current pulse of 175 A at a temperature T of −10° C. and a state of charge SOC of 85% is only permissible for 10 s. A predictive time constant $\tau_{pred}$ and a limiting mean value $i_{pred}$, which converge to a continuous current $i_{cont}$, are calculated. From FIG. 5A, it can further be seen that, at time point t=20 s, i.e. after 10 s following the transmission of the first current pulse, the reduction of the first current pulse commences. The first current pulse is reduced to the continuous current $i_{cont}$. Only at the end of the first current pulse does the limiting mean value $i_{pred}$ begin to rise again, in order to permit a further current pulse. At time point t=100s, a second current pulse, which is equal to the first current pulse, is transmitted to the battery cell. Given the loaded state of the battery cell, reduction of the second current pulse commences earlier.

Figure 6A:
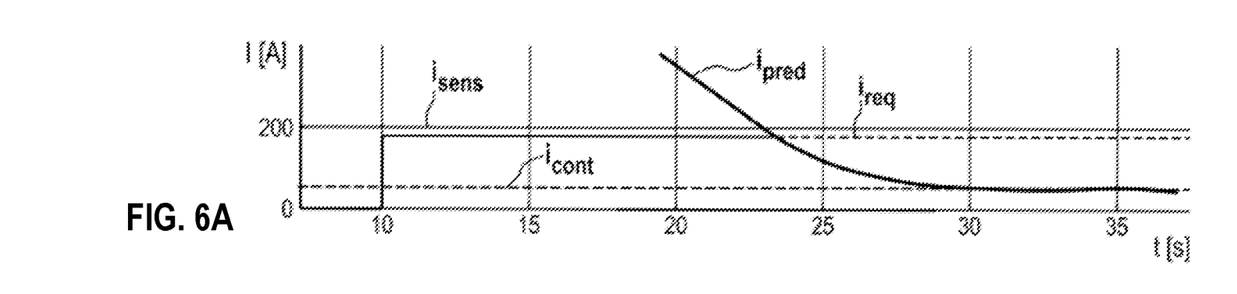
FIG. 6A shows a schematic representation of a temporal characteristic of a charging current $i_{req}$, with limitation of the mean value $i_{avrg}$ thereof, according to a second example.
Figure 6B:
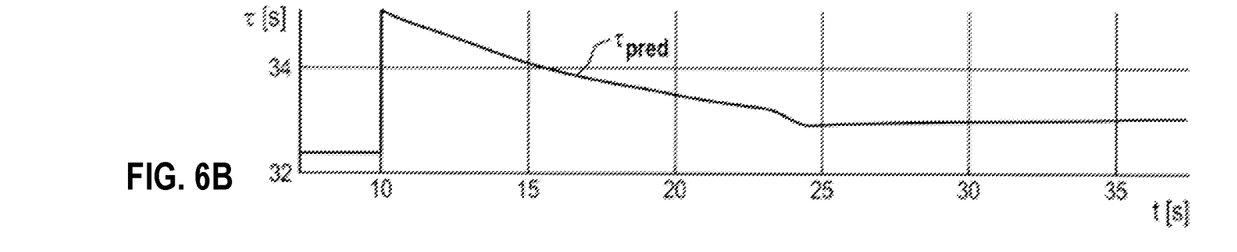
FIG. 6B shows a schematic representation of a temporal characteristic of a predictive time constant $\tau_{pred}$ according to FIG. 6A.
Figure 6C:
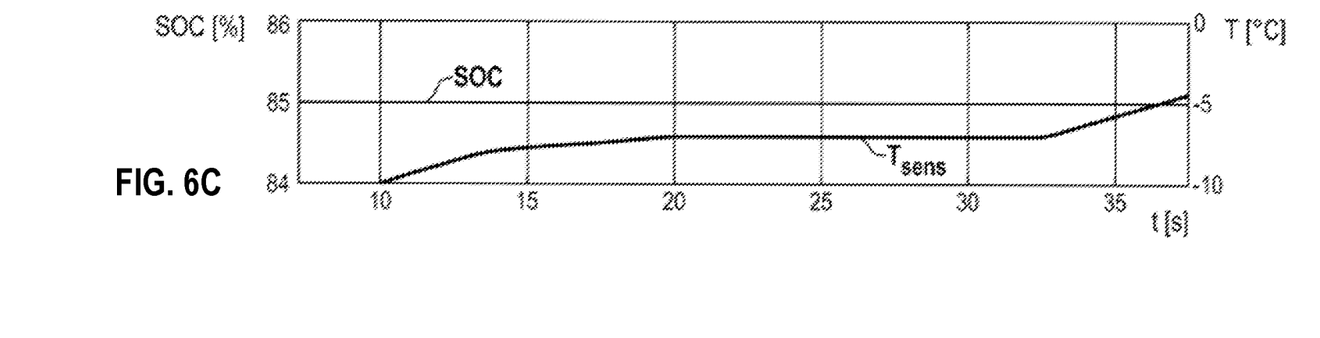
FIG. 6C shows a schematic representation of a temporal characteristic of a state of charge SOC and a temporal characteristic of a measured temperature $T_{sens}$ according to FIG. 6A.

FIG. 6A shows a schematic representation of a temporal characteristic of a charging current $i_{req}$, with limitation of the mean value $i_{avrg}$ thereof, according to a second example, whereas FIG. 6B shows a schematic representation of a temporal characteristic of a predictive time constant $\tau_{pred}$ according to FIG. 6A, and FIG. 6C shows a schematic representation of a temporal characteristic of a state of charge SOC and a temporal characteristic of a measured temperature $T_{sens}$ according to FIG. 6A.

The temporal characteristics are represented for a relaxed battery cell having an initial state of charge SOC of 85%. An initial temperature T of the battery cell is −10° C. The battery cell is charged with a charging current $i_{req}$ of 175 A for a time of 30s. The state of charge SOC remains unchanged, whereas the measured temperature $T_{sens}$ rises during the duration of the current pulse.

From FIG. 6A, it can be seen that, at time point t=10 s, a current pulse, which represents the charging current $i_{req}$, having a measured value $i_{sens}$ of 175 A, is transmitted to the battery cell. The duration of the current pulse is 30s. From the data sheet for the battery cell, it can be determined that a current pulse of 175 A at a temperature T of −10° C. and a state of charge SOC of 85% is only permissible for 10 s. A predictive time constant $\tau_{pred}$ and a limiting mean value $i_{pred}$, which converges to a continuous current $i_{cont}$, are calculated. As the measured temperature $T_{sens}$ of the battery cell varies over the duration of the current pulse, the predictive time constant $\tau_{pred}$ is calculated dynamically. From FIG. 6A, it can further be seen that the reduction of the current pulse commences somewhat later. The current pulse reduces to the continuous current $i_{cont}$. The continuous current $i_{cont}$ also adjusts to the temperature T.

Figure 7:
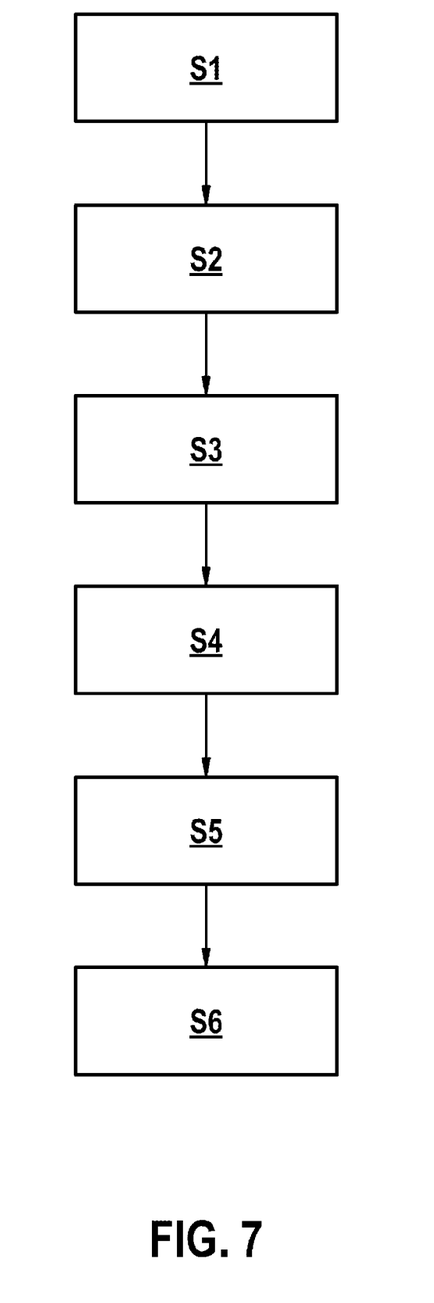
FIG. 7 shows a sequence for the method according to the invention.

FIG. 7 shows a sequence for the method according to the invention. In a step S1, for a measured temperature $T_{sens}$ and a prescribed state of charge SOC, reference currents $i_{ref}$ are determined for various time intervals $t_{ref}$. For example, for a measured temperature $T_{sens}$ of 25° C. and a prescribed state of charge SOC, reference currents $i_{ref2s}$, $i_{ref10s}$, $i_{ref30s}$ are determined for the corresponding time intervals $t_{ref}$ of 2 s, 10 s and 30s. If, for example, the temperatures T defined in the cell data sheet are from 20° C. and 30° C., these reference currents $i_{ref}$ can be interpolated, if this is permitted by the cell data sheet.

In a step S2, for each reference current $i_{ref}$ a corresponding reference time constant $\tau_{ref}$ is calculated by the application of a model for the calculation of a mean value $i_{avrg}$ of a charging current $i_{req}$ with reference to a continuous current $i_{cont}$, which corresponds to the minimum current permissible without lithium plating. For example, if it proceeds from the cell data sheet that a current of 150 A is only permitted to last for 2 s, this current must then be permitted for 2 s or less. To this end, the reference time constant $\tau_{ref}$ is adjusted such that the limiting value for current occurs at 2 s or earlier. For example, for the respective reference currents $i_{ref2s}$, $i_{ref10s}$ and $i_{ref30s}$, a corresponding reference time constant $\tau_{ref2s}$, $\tau_{ref10s}$ and $\tau_{ref30s}$ is calculated. The model is preferably configured in the form of a PT1-element.

In a step S3, with reference to the calculated reference time constants $\tau_{ref}$ and the reference currents $i_{ref}$ determined, a diagram is constituted for the relationship between the reference time constant $\tau_{ref}$ and the reference current $i_{ref}$ for each specified temperature T and each specified state of charge SOC.

In a step S4, a predictive time constant $\tau_{pred}$ is determined by the comparison of a measured value $i_{sens}$ of a charging current $i_{req}$ with the reference currents $i_{ref}$. If the measured value $i_{sens}$ of the charging current $i_{req}$ is equal to a reference current $i_{ref}$, the predictive time constant $\tau_{pred}$ is equal to the reference time constant $t_{ref}$ which corresponds to this reference current $i_{ref}$. Otherwise, the predictive time constant $\tau_{pred}$ is determined by interpolation.

In a step S5, a predictive limiting mean value $i_{pred}$ of the charging current $i_{req}$ is calculated on the basis of the continuous current $i_{cont}$, a predictive time $t_{pred}$ and the predictive time constant $\tau_{pred}$. The predictive time can be customer-specific.

In a step S6, on the basis of the limiting mean value $i_{pred}$, a first predictive limiting value $i_{predS}$ for a short predictive time $t_{predS}$, a second predictive limiting value $i_{predL}$ for a long predictive time $t_{predL}$ and a third predictive limiting value $i_{predP}$ for a continuous predictive time $t_{predP}$ are calculated. For example, a time of less than 2 s can be defined as a short predictive time $t_{predS}$. For example, a long predictive time $t_{predL}$ can be equal to 2 s, whereas a continuous predictive time $t_{predP}$ can be equal to 10 s.

The invention is not limited to the exemplary embodiments described herein and the aspects thereof indicated. Instead, within the field indicated by the claims, a plurality of variations are possible, which lie within the practice of a person skilled in the art.

The invention claimed is:

1. A method for controlling a charging current limiting value for a battery management system, comprising the following steps:
   Determination, for a measured temperature $T_{sens}$ and a prescribed state of charge SOC, of reference currents $i_{ref}$ for various time intervals $t_{ref}$;
   Calculation of a corresponding reference time constant $\tau_{ref}$ for each reference current $i_{ref}$ by the application of a model for the calculation of a mean value $i_{avrg}$ of a charging current $i_{req}$ with reference to a continuous current $i_{cont}$, which corresponds to the minimum current permissible without lithium plating;
   Constitution of a diagram for the relationship between the reference time constant $\tau_{ref}$ and the reference current $i_{ref}$, with reference to the calculated reference time constants $\tau_{ref}$ and the reference currents $i_{ref}$ determined for each specific temperature T and each specific state of charge SOC;
   Determination of a predictive time constant $\tau_{pred}$ by the comparison of a measured value $i_{sens}$ of a charging current $i_{req}$ with the reference currents $i_{ref}$; and
   Calculation of a predictive limiting mean value $i_{pred}$ of the charging current $i_{req}$, on the basis of the continuous current $i_{cont}$, a predictive time $t_{pred}$ and the predictive time constant $\tau_{pred}$.

2. The method according to claim 1, wherein the model for the calculation of a mean value $i_{avrg}$ of the charging current $i_{req}$ is configured in the form of a PT1-element.

3. The method according to claim 2, wherein an additional point $[i_{min}; \tau_{relax}]$ is inserted in the diagram for the relationship between the reference time constant $\tau_{ref}$ and the reference current $i_{ref}$.

4. The method according to claim 1, wherein the calculation of the predictive time constant $\tau_{pred}$ corresponding to the measured value $i_{sens}$ of the charging current $i_{req}$ is executed by linear interpolation.

5. The method according to claim 1, wherein, a first predictive limiting value $i_{predS}$ for a short predictive time $t_{predS}$, a second predictive limiting value $i_{predL}$ for a long predictive time $t_{predL}$, and a third predictive limiting value $i_{predP}$ for a continuous predictive time $t_{predP}$ are calculated.

6. The method according to claim 5, wherein a constant $k = e^{t_{pred}/\tau}$ is defined in the calculation of the first predictive limiting value $i_{predS}$.

7. A battery management system configured to control a charging current limiting value for a battery management system, by:
   determining, for a measured temperature $T_{sens}$ and a prescribed state of charge SOC, reference currents $i_{ref}$ for various time intervals $t_{ref}$;
   calculating a corresponding reference time constant $\tau_{ref}$ for each reference current $i_{ref}$ by the application of a model for the calculation of a mean value $i_{avrg}$ of a charging current $i_{req}$ with reference to a continuous current $i_{cont}$, which corresponds to the minimum current permissible without lithium plating;
   constituting a diagram for the relationship between the reference time constant $\tau_{ref}$ and the reference current $i_{ref}$, with reference to the calculated reference time constants $\tau_{ref}$ and the reference currents $i_{ref}$ determined for each specific temperature T and each specific state of charge SOC;
   determining a predictive time constant $\tau_{pred}$ by the comparison of a measured value $i_{sens}$ of a charging current $i_{req}$ with the reference currents $i_{ref}$; and
   calculating a predictive limiting mean value $i_{pred}$ of the charging current $i_{req}$, on the basis of the continuous current $i_{cont}$, a predictive time $t_{pred}$ and the predictive time constant $\tau_{pred}$.

8. A battery having one or more battery cells, which is configured to control a charging current limiting value for a battery management system, by:
   determining, for a measured temperature $T_{sens}$ and a prescribed state of charge SOC, reference currents $i_{ref}$ for various time intervals $t_{ref}$;
   calculating a corresponding reference time constant $\tau_{ref}$ for each reference current $i_{ref}$ by the application of a model for the calculation of a mean value $i_{avrg}$ of a charging current $i_{req}$ with reference to a continuous current $i_{cont}$, which corresponds to the minimum current permissible without lithium plating;
   constituting a diagram for the relationship between the reference time constant $\tau_{ref}$ and the reference current $i_{ref}$, with reference to the calculated reference time constants $\tau_{ref}$ and the reference currents $i_{ref}$ determined for each specific temperature T and each specific state of charge SOC;

determining a predictive time constant $\tau_{pred}$ by the comparison of a measured value $i_{sens}$ of a charging current $i_{req}$ with the reference currents $i_{ref}$; and calculating a predictive limiting mean value $i_{pred}$ of the charging current $i_{req}$, on the basis of the continuous current $i_{cont}$, a predictive time $t_{pred}$ and the predictive time constant $\tau_{pred}$.

9. A vehicle, which comprises a battery management system configured to control a charging current limiting value for a battery management system, by:

determining, for a measured temperature $T_{sens}$ and a prescribed state of charge SOC, reference currents $i_{ref}$ for various time intervals $t_{ref}$;

calculating a corresponding reference time constant $\tau_{ref}$ for each reference current $i_{ref}$ by the application of a model for the calculation of a mean value $i_{avrg}$ of a charging current $i_{req}$ with reference to a continuous current $i_{cont}$, which corresponds to the minimum current permissible without lithium plating;

constituting a diagram for the relationship between the reference time constant $\tau_{ref}$ and the reference current $i_{ref}$, with reference to the calculated reference time constants $\tau_{ref}$ and the reference currents $i_{ref}$ determined for each specific temperature T and each specific state of charge SOC;

determining a predictive time constant $\tau_{pred}$ by the comparison of a measured value $i_{sens}$ of a charging current $i_{req}$ with the reference currents $i_{ref}$; and calculating a predictive limiting mean value $i_{pred}$ of the charging current $i_{req}$, on the basis of the continuous current $i_{cont}$, a predictive time $t_{pred}$ and the predictive time constant $\tau_{pred}$.

* * * * *